(12) United States Patent
Roux et al.

(10) Patent No.: US 10,299,398 B2
(45) Date of Patent: May 21, 2019

(54) SUPPORT DEVICE FOR PAYMENT TERMINAL

(71) Applicant: INGENICO GROUP, Paris (FR)

(72) Inventors: Julien Roux, Caluire (FR); Franck Robert, Suresne (FR); Philippe Dedieu, Guilherand-Granges (FR)

(73) Assignee: INGENICO GROUP, Paris (FR)

( * ) Notice: Subject to any disclaimer, the term of this patent is extended or adjusted under 35 U.S.C. 154(b) by 0 days.

(21) Appl. No.: 15/909,522

(22) Filed: Mar. 1, 2018

(65) Prior Publication Data
US 2018/0255657 A1 Sep. 6, 2018

(30) Foreign Application Priority Data

Mar. 2, 2017 (FR) ...................................... 17 51720

(51) Int. Cl.
| | |
|---|---|
| H02B 1/20 | (2006.01) |
| H05K 5/02 | (2006.01) |
| F16M 11/08 | (2006.01) |
| G06F 1/16 | (2006.01) |
| G06F 1/18 | (2006.01) |
| G07G 1/00 | (2006.01) |
| H02G 3/08 | (2006.01) |

(52) U.S. Cl.
CPC ........... *H05K 5/0247* (2013.01); *F16M 11/08* (2013.01); *G06F 1/1632* (2013.01); *G06F 1/181* (2013.01); *G07G 1/0018* (2013.01); *H02G 3/083* (2013.01); *H05K 5/0234* (2013.01); *F16M 2200/08* (2013.01); *G06F 2200/1639* (2013.01)

(58) Field of Classification Search
CPC .. H05K 5/0247; H05K 5/0234; G06F 1/1632; G06F 2200/1639

USPC ......................................................... 361/827
See application file for complete search history.

(56) References Cited

U.S. PATENT DOCUMENTS

| | | | | |
|---|---|---|---|---|
| 5,143,868 A | * | 9/1992 | Caveney | ................ H01R 13/73 439/535 |
| 5,802,459 A | | 9/1998 | Burke et al. | |

(Continued)

FOREIGN PATENT DOCUMENTS

| | | |
|---|---|---|
| WO | 9706716 A1 | 2/1997 |
| WO | 2016039778 A1 | 3/2016 |

OTHER PUBLICATIONS

French Search Report and Written Opinion dated Oct. 24, 2017 for French Patent Application No. 1751720, filed Mar. 2, 2017.

(Continued)

*Primary Examiner* — Hung S. Bui
(74) *Attorney, Agent, or Firm* — David D. Brush; Westman, Champlin & Koehler, P.A.

(57) ABSTRACT

A support device for a payment terminal includes a base adapted to receive a plurality of connection cables on a rear face, and a cover adapted to mount in translation on the base and enabling concealment of the connection cables when the plurality of connection cables is connected to the rear face of the base. The cover has three apertures configured to enable passage of connection cables connected to the rear face of the base. The three apertures are formed respectively on a left lateral face, a right lateral face and a rear face of the cover. The base is mounted on a footing having an aperture configured to enable passage of connection cables connected to the rear face.

9 Claims, 3 Drawing Sheets

(56) References Cited

U.S. PATENT DOCUMENTS

| | | | |
|---|---|---|---|
| 6,460,642 B1* | 10/2002 | Hirano | B60K 6/40 |
| | | | 180/271 |
| 8,243,469 B2* | 8/2012 | Jaze | H05K 9/0018 |
| | | | 174/32 |
| 2005/0213295 A1 | 9/2005 | Perez et al. | |
| 2006/0034026 A1* | 2/2006 | Chiku | H05K 7/1449 |
| | | | 361/85 |
| 2006/0133016 A1 | 6/2006 | North et al. | |
| 2008/0042020 A1 | 2/2008 | Laitila et al. | |
| 2009/0057502 A1 | 3/2009 | Takamatsu et al. | |

OTHER PUBLICATIONS

English Translation of the French Written Opinion dated Oct. 24, 2017 for French Patent Application No. 1751720, filed Mar. 2, 2017.

\* cited by examiner

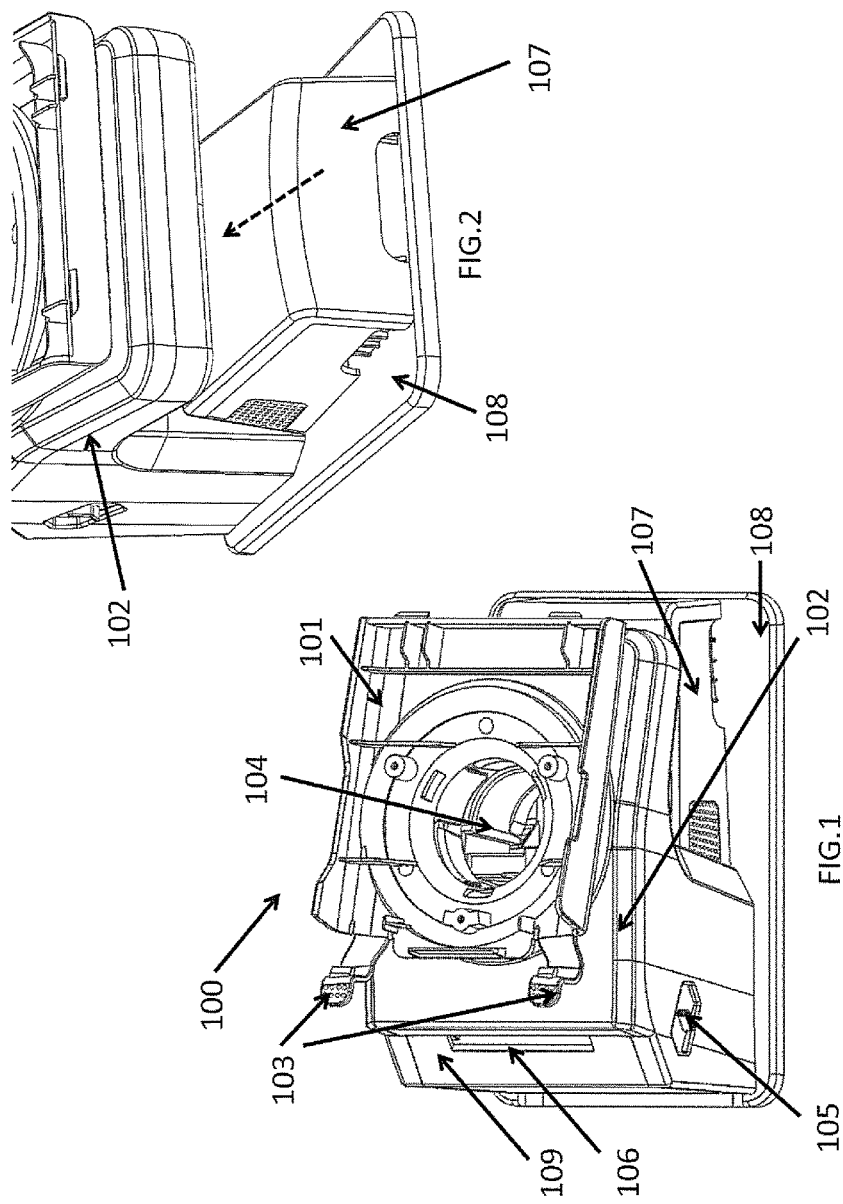

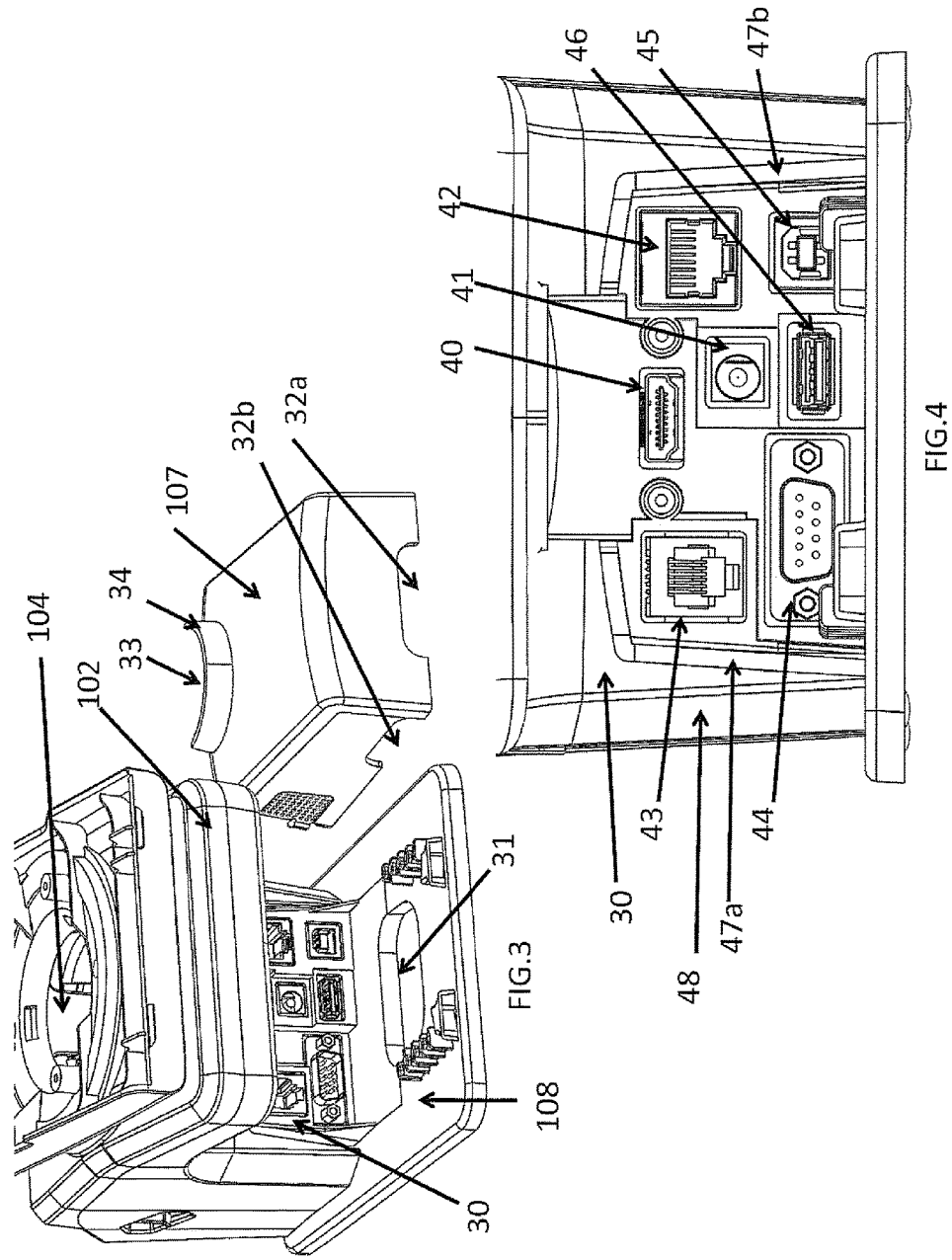

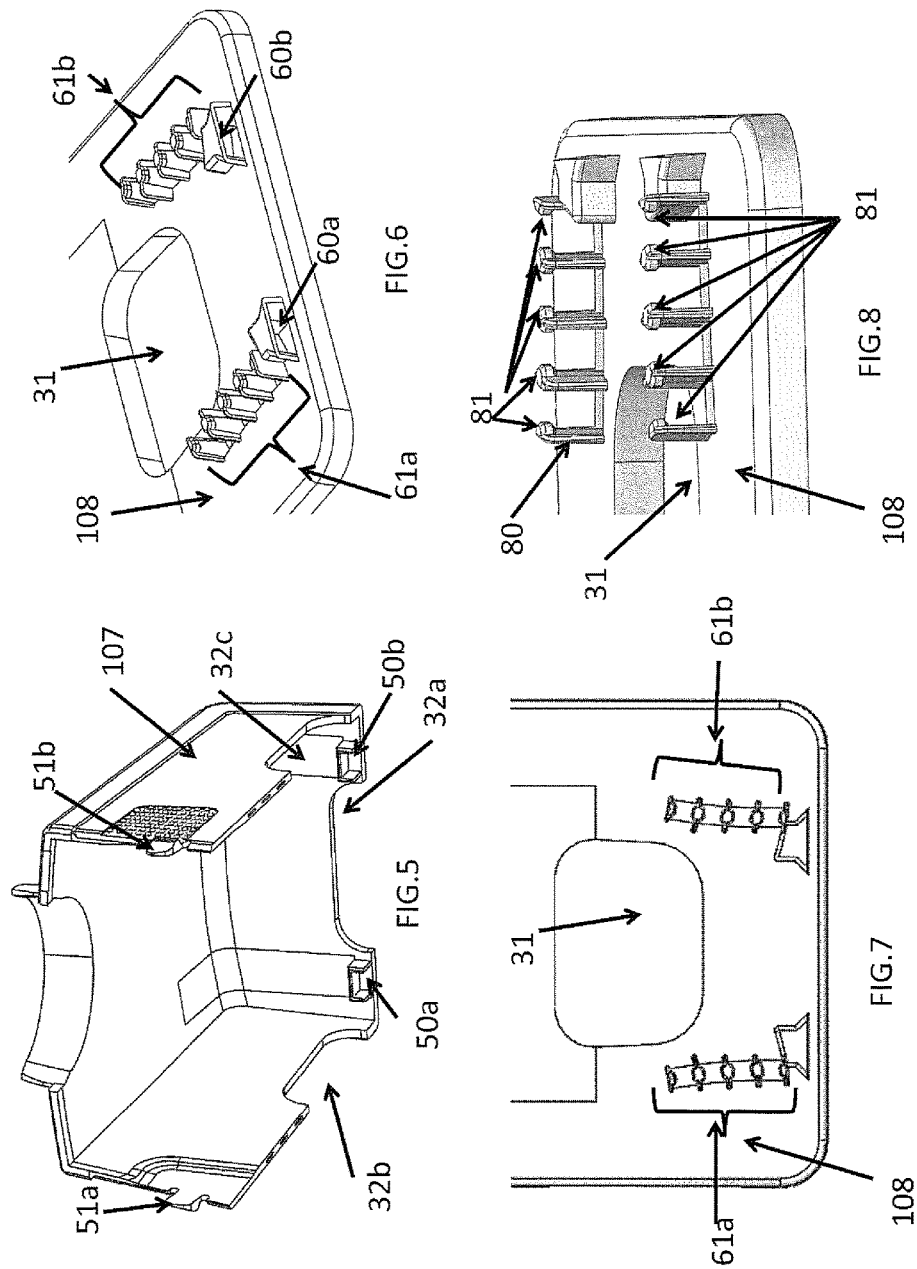

SUPPORT DEVICE FOR PAYMENT TERMINAL

1. FIELD OF THE INVENTION

The invention relates to the field of supports used to movably affix an apparatus to a base and relates especially to supports for payment terminals.

2. PRIOR ART

In order to carry an electronic payment transaction between a purchaser and a merchant, it is possible to use an electronic payment terminal installed in the merchant's shop for example.

Such a payment terminal is for example an electronic terminal capable of reading the data of a bank card inserted into the apparatus or positioned in proximity to the apparatus in the case of what is called contactless payment. Such a payment terminal is connected to a communications network in order to transmit electronic data on the transaction to an authentication server There are payment terminals adapted to being mounted on a support comprising a fixed base, for example placed on a merchant's counter, and a plate mounted so as to be mobile on the base so that the payment terminal can turned to face the merchant or face the purchaser depending on the person who has to interact with the payment terminal during a payment transaction.

The payment terminal must generally be connected to an electrical current supply, a communications network and other items of equipment such as a cash register, a computer etc.

Thus, many connection cables can be connected to the payment terminal and, more particularly, to the base to which the payment terminal is affixed.

The different devices and a power connectors or network connectors can be laid out in different ways depending on the configuration of the merchant's premises. This means that it is not easy to plan or foresee the direction from which the connection cable will arrive at the base of the support of the payment terminal.

In addition, the presence of many connection cables connected to the base of the support of the payment terminal can be unattractive.

3. SUMMARY OF THE INVENTION

The invention provides an improvement to the prior art. It relates to a support device for a payment terminal comprising a base adapted to receiving a plurality of connection cables on a rear face, and a cover adapted to being mounted in translation on the base and enabling the concealment of said connection cables when the plurality of connection cables is connected to said rear face of the base.

Advantageously, the cover has three apertures configured to enable the passage of connection cables connected to said rear face of the base, the three apertures being formed respectively on a left lateral face, a right lateral face and a rear face of the cover, and the base is mounted on a footing comprising an aperture configured to enable the exit, towards the ground, of connection cables connected to said rear face.

The support device thus enables the concealment of the connection cables connected to the base while at the same time offering several exit directions for these cables. Indeed, four exit directions are possible, towards the left of the support device, towards the right of the support device, towards the rear of the support device or towards the ground. Thus, the exits of the cable of the support device are easy to lay out whatever the configuration of the merchant's premises, while at the same time the connections of the cables to the base are concealed.

According to one particular embodiment of the invention, the apertures in the cover are formed on the lower edge of the faces of the cover. These apertures have a length of 40 mm and a height of 8 mm.

According to one particular embodiment of the invention, the cover comprises an affixation lug in front of the left lateral face and an affixation lug on the front of the right lateral face, said affixation lugs being intended for insertion in housings provided on the base, on either side of the rear face of the base. Thus, once mounted on the base by translation, the cover is maintained fixed to the front relative to the base.

According to one particular embodiment of the invention, the cover also comprises two hooks within the rear face of the cover and placed on either side of the aperture of the rear face of the cover, said hooks being intended for insertion in housings provided on the rear edge of the footing of the base. Thus, the rear of cover is kept fixed to the footing of the support device.

According to one particular embodiment of the invention, the footing comprises guiding means on a rear part of the footing and on either side of the aperture formed in the footing. These guiding means are configured to guide the connection cables towards the aperture of the right lateral face of the cover or towards the aperture of the left lateral face of the cover. These guiding means are placed on the footing facing apertures formed on the lateral faces of the cover when the cover is mounted on the support device. These guiding means enable an easier positioning of the cover when the cables are connected to the rear face of the base and have to exit towards the left or the right of the support device. Indeed, the guiding means make it possible to maintain the cables at the level of the lateral apertures even when the cover is not mounted. Thus, during the mounting of the cover, it is not necessary for a user to hold the cables or to re-arrange the positioning of the cables to mount the cover.

According to one particular embodiment of the invention, the guiding means comprise an odd number of substantially aligned ribs, said ribs being spaced so that a connection cable can pass between two ribs. According to one particular embodiment of the invention, the ribs are spaced by 6.2 mm. Such a spacing is wide enough for the passage of most of the connection cables while at the same time being narrow enough to hold the cables in the planned exit direction.

According to one particular embodiment of the invention, the ribs comprise a spike formed at the center and on top of the rib so that a cable passing between two ribs is blocked towards the bottom by the spike. Thus, the two cables passing between the ribs are held along the vertical axis and there is no risk of their being dislodged vertically from the guide.

4. LIST OF FIGURES

Other features and advantages of the invention shall appear more clearly from the following description of one particular embodiment given by way of a simple illustratory and non-exhaustive example and from the appended figures of which:

FIG. 1 presents a schematic top view of the support device for a payment terminal according to one particular embodiment of the invention;

FIG. 2 presents a schematic rear view of the support device for a payment terminal according to one particular embodiment of the invention;

FIG. 3 presents a schematic rear view of the support device for a payment terminal according to one particular embodiment of the invention in which the cover has been removed from the base of the support device;

FIG. 4 presents a schematic view of the rear face of the base of the support device for a payment terminal according to one particular embodiment of the invention;

FIG. 5 is a view in perspective or three-quarter view of the cover configured for installation on the rear face of the base of the support device for a payment terminal according to one particular embodiment of the invention;

FIG. 6 illustrates a schematic view of the footing of the support device for a payment terminal according to one particular embodiment of the invention;

FIG. 7 illustrates a schematic top view of the footing of the support device for a payment terminal according to one particular embodiment of the invention;

FIG. 8 illustrates a schematic side view of the footing of the support device for a payment terminal according to one particular embodiment of the invention.

5. DESCRIPTION OF ONE EMBODIMENT OF THE INVENTION

5.1 General Principle

The invention relates to a support device for a payment terminal comprising a base configured to receive a plurality of connection cables and a cover, also called a cable cover, configured to be installed on the base and concealing the connection cables connected to the base.

Advantageously, the support device comprises several cable exits placed along four directions behind the support device so that the base can be easily connected with the base, whatever the environment in which the support device is placed.

Advantageously, the support device also comprises a footing on which cable guides are made to guide a cable towards the exterior along the exit direction chosen for this cable.

Thus, the cables connected to the base are laid out accurately, in limiting the overlapping and entanglement of cables.

5.2 Examples of Implementation

FIG. 1 presents a schematic slanted view of the support device (100) for a payment terminal according to one particular embodiment of the invention.

The support (100) comprises a base (102) and a plate (101) mounted on the base so as to be rotationally mobile. The plate (101) is capable of receiving the payment terminal and comprises affixing means to affix the payment terminal to the plate. For example, the means for affixing the payment terminal to the plate are clips (103) that hook the top of the payment terminal when the payment terminal is placed on the plate. Other means for affixing the payment terminal to the plate (101) are of course possible.

The support (100) comprises a through-hole (104) formed in the plate and in the base. Through this hole, connection cables can be made to pass in order to connect the base (102) to the payment terminal. The base (102) and the plate (101) are affixed by clips (not shown) placed on the base inside the through-hole (104) and permitting the rotation of the plate relative to the base.

The base also comprises connection elements (not shown in FIG. 1) enabling the base to be connected to different devices or electric current connectors or network connectors necessary for the functioning of the payment terminal. These connection elements are placed under the cover (107) of the base. A cable or cables can be placed in the through-hole (104) in order to connect the payment terminal to the connection elements of the base (102) when this terminal is placed on the plate (101).

In a classic way, the base (102) also comprise a footing (108) to place the support on a plane surface, a slot (106) through which printed payment receipts may exit from a paper-holder hatch (109), a button (105) to open the paper-holder hatch (109).

The base (102) also comprises a cover (107) to conceal the components and the connection elements of the base (102).

FIG. 2 more specifically presents a schematic rear view of the support device for a payment terminal according to one particular embodiment of the invention. FIG. 2 illustrates the rear face of the base (102). The connection elements of the rear face of the base (102) illustrated in FIG. 4 are concealed by the cover (107). The cover (107) is mounted on the base (102) by translation from the rear towards the front (represented by the dotted arrow in FIG. 2) by sliding on the footing (108) of the support device.

FIG. 3 presents a rear schematic view of the support device for a payment terminal according to one particular embodiment of the invention, in which the cover (107) has been removed from the base (102) of the support device.

The rear face (30) of the base (102) has a plurality of connection elements enabling different pieces of equipment or connectors to be connected through cables to the base (102).

FIG. 4 illustrates a schematic view of the rear face (30) and an example of connection elements present on this face (30). According to one particular embodiment of the invention, the rear face (30) of the base (102) comprises an RJ 11 modem connector (43), an RS-232-DB9 serial port (44), an RJ 45 Ethernet port (42), a USB B port (45), a USB A port (46), a DC power jack connector (41). These different connection elements are concentrated in one connector output (40) to be connected to the payment terminal through a cable passing through the through hole (104) illustrated in FIG. 1 when the payment terminal is placed on the plate (101).

The cover (107) is illustrated in FIG. 3 and in FIG. 5. The cover (107) comprises three apertures (32a, 32b and 32c) configured to enable the passage of at least one connection cable connected to the rear face (30) of the base. The apertures (32a, 32b, 32c) are formed respectively on the rear face of the cover (107), and on the left lateral face and the right lateral face of the cover.

The apertures (32a, 32b and 32c) are formed on the lower edge of the rear, left lateral and right lateral faces of the cover. They are sized so that the cables can pass through the aperture while leaving the cover (107) in position when it is mounted by translation on the base (102) and the footing (108). For example the apertures (32a, 32b and 32c) have a length of 40 mm and a height of 8 mm.

The upper face of the cover (107) has an aperture (33) in the form of an arc on the front, surmounted by a rib (34) that runs along the aperture (33). The aperture (33) and the rib

(34) enable the lower edges of the through hole (104) of the base (102) to be extended when the cover (107) is mounted on the base (102) and the footing (108). Thus, the connection element (40) and the cable (not shown) connected to this connection element and linked to the payment terminal are protected at the junction between the cover (107) and the rear face (30) of the base (102).

As illustrated in FIG. 5, the cover comprises an affixation lug (51a) in the front of the left lateral face and an affixation lug (51b) in the front of the right-hand lateral face. Such affixation lugs (51a, 51b) are intended for insertion in housings (47a, 47b illustrated in FIG. 4) provided on the base (102), on either side of the rear face (30). These housings correspond for example to a space provided between the face (30) and the cladding (48) of the base (102).

The cover (107) also comprises two hooks (50a, 50b) in the interior of the rear face of the cover and placed on either side of the aperture (32a) on the rear face of the cover. Such hooks (50a, 50b) are intended for insertion into housings ((60a and 60b illustrated in FIG. 6) provided on the rear edge of the footing (108) of the base (102).

As illustrated in FIG. 3, the base (102) is fixedly mounted on a footing (108). The rear face (30) of the base (102) is substantially perpendicular to the footing (108). Advantageously, the footing (108) comprises an aperture (31) configured to enable the passage of at least one connection cable connected to said rear face towards the ground. Since the footing (108) is fixed relative to the base (102), the aperture (31) is sized so that it is easy to install the connection cables that have to pass through the aperture (31). For example, the aperture (31) is substantially trapezoidal with a height of 38 mm, and a base having a length of 52.5 mm.

As illustrated in FIGS. 3 and 6-8, the footing (108) comprises, on its rear part and on either side of the aperture (31) formed in the footing (108), guiding means (61a, 61b) used to guide connection cables connected to the rear face (30) of the base (102) towards the aperture (32b, 32c) of one of the lateral faces of the cover (107).

These guiding means are implemented in the form of ribs (80), substantially aligned along an arc of very small curvature in a direction orthogonal to the rear face (30) of the base (102). In FIG. 7, the ribs are placed along an arc of small curvature to enable an installation of the cables that becomes easier with distance from the base. Such a representation of the ribs is only an illustrative example and an alignment of the ribs along an axis perpendicular to the rear face is also possible.

On either side of the aperture (31), the guiding means comprise an odd number of ribs. For example, five ribs are formed on either side of the aperture (31) making it possible to bring out up to four connection cables by the right and four connection cables by the left.

It is also possible to envisage guiding means in the form of ribs placed perpendicularly to the guiding means (61a, 61b) and formed between the edge of the aperture (31) and the rear edge of the footing (108) so that the connection cables that have to exit by the rear are also guided.

The ribs are formed in such a way that the spacing between two ribs enables any type of connection cable to pass between two ribs. For example, the ribs are spaced by 6.2 mm.

Such a spacing is wide enough for the passage of most connection cables while being narrow enough to hold the cable in the planned exit direction.

As illustrated in FIG. 8, the ribs (80) each comprise a spike (81) formed at the center of the rib and on top of the rib so that a cable passing between two ribs is blocked towards the bottom by the spike (81). At the height of the spikes, the spacing between two ribs is smaller than spacing at the bottom of the ribs. The spacing between the ribs at the height of the spikes is for example 4.2 mm.

The insertion of a cable between two ribs is then done by playing with the flexibility of the cladding of the cable by gently forcing passage through the narrowed portion of the space between the ribs at the level of the spikes.

The cables passing between the ribs are maintained along the vertical axis and there is no risk of their being dislodged vertically from the guide.

The cover (107) is mounted on the support device by translation. The front face of the cover (107) comprising the aperture (33) is placed facing the rear face (30) of the base (102) in contact with the footing (108). The rear of the cover (107) is slightly raised if cables connected to the rear face (30) of the base (102) are held towards the right and left exits of the device. The cover (107) is then made to slide towards the base (102), the affixation lugs (51a, 51b) are inserted into housings provided around the rear face (30) of the base (102). During the translation of the cover (107) towards the base (102), when the apertures (32b and 32c) formed on the lateral faces of the cover (107) are placed so as to be facing cables held by the footing (108) towards the left and right exits from the device, the rear of the cover (107) can get lowered and come into contact with the footing (108). The translation of the cover (107) continues along the footing (108) until the hooks (50a, 50b) get inserted into the housings (60a, 60b) provided for them and block the translation of the cover (107). The cover (107) is then in position on the device (100) as illustrated in FIGS. 1 and 2.

The invention claimed is:

1. A support device for a payment terminal, comprising:
   a base having a rear face and adapted to receiving a plurality of connection cables on the rear face; and
   a cover adapted to being mounted in translation on the base and enabling concealment of said plurality of connection cables when the plurality of connection cables is connected to said rear face of the base;
   wherein the cover has first, second and third apertures configured to enable passage of the plurality of connection cables connected to said rear face of the base, the first, second and third apertures being formed respectively on a left lateral face, a right lateral face and a rear face of the cover, and wherein the cover has an upper face having an aperture in the form of an arc on a front of the upper face, which is surmounted by a rib that runs along the aperture,
   wherein the base is mounted on a footing comprising an aperture configured to enable exit, towards the ground, of the plurality of connection cables connected to said rear face of the base.

2. The support device according to claim 1, wherein said first, second and third apertures in the cover are formed on a lower edge of the left lateral face, right lateral face and rear face of the cover.

3. The support device according to claim 2, wherein said left lateral face, a right lateral face and a rear face apertures of the cover have a length of 40 mm and a height of 8 mm.

4. The support device according to claim 1, wherein the cover comprises an affixation lug in front of the left lateral face and an affixation lug on a front of the right lateral face, said affixation lugs being configured for insertion in housings provided on the base, on either side of the rear face of the base.

5. The support device according to claim 4, wherein the cover also comprises first and second hooks within the rear face of the cover and placed on either side of the third aperture of the rear face of the cover, said hooks being configured for insertion in housings provided on a rear edge of the footing of the base.

6. The support device according to claim 1, wherein the footing comprises, on a rear part of the footing and on either side of the aperture formed in the footing, a guide configured to guide the connection cables towards the second aperture of the right lateral face of the cover or towards the first aperture of the left lateral face of the cover.

7. The support device according to claim 6, wherein the guide comprises an odd number of substantially aligned ribs, said ribs being spaced so that a connection cable can pass between two of the ribs.

8. The support device according to claim 7, wherein said ribs are spaced by 6.2 mm.

9. The support device according to claim 8, wherein each rib comprises a spike formed at a center and on top of the rib so that a cable passing between two of the ribs is blocked towards a bottom by the spike.

* * * * *